US012167588B2

(12) United States Patent
Li

(10) Patent No.: US 12,167,588 B2
(45) Date of Patent: Dec. 10, 2024

(54) SEMICONDUCTOR DEVICES AND PREPARATION METHODS THEREOF

(71) Applicant: CHANGXIN MEMORY TECHNOLOGIES, INC., Hefei (CN)

(72) Inventor: Yukun Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/613,599

(22) PCT Filed: May 28, 2021

(86) PCT No.: PCT/CN2021/096950
§ 371 (c)(1),
(2) Date: Nov. 23, 2021

(87) PCT Pub. No.: WO2022/095425
PCT Pub. Date: May 12, 2022

(65) Prior Publication Data
US 2023/0301069 A1   Sep. 21, 2023

(30) Foreign Application Priority Data

Nov. 4, 2020 (CN) .......................... 202011215879.3

(51) Int. Cl.
*H10B 12/00* (2023.01)
(52) U.S. Cl.
CPC .......... *H10B 12/34* (2023.02); *H10B 12/053* (2023.02)
(58) Field of Classification Search
None
See application file for complete search history.

(56) References Cited

U.S. PATENT DOCUMENTS

| 10,211,086 | B2 | 2/2019 | Nagai |
| 2002/0011644 | A1 | 1/2002 | Lee |
| 2004/0124491 | A1 | 7/2004 | Yamashita et al. |
| 2014/0120691 | A1 | 5/2014 | Lee et al. |
| 2016/0079246 | A1 | 3/2016 | Kim et al. |
| 2018/0286742 | A1* | 10/2018 | Nagai ............... H01L 21/76224 |

FOREIGN PATENT DOCUMENTS

| CN | 1218379 C | 9/2005 |
| CN | 104952783 A | 9/2015 |

OTHER PUBLICATIONS

International Search Report in Application No. PCT/CN2021/096950, mailed on Aug. 26, 2021.

\* cited by examiner

*Primary Examiner* — Hsien Ming Lee
(74) *Attorney, Agent, or Firm* — Syncoda LLC; Feng Ma

(57) ABSTRACT

A preparation method for a semiconductor device includes: providing a semiconductor substrate, the semiconductor substrate having shallow trenches and active regions defined by the shallow trenches, the active regions extending in a first direction; forming isolation layers in the first direction at interfaces between the shallow trenches and the active regions, the isolation layers and the active regions being inverse types to each other; forming shallow trench isolation structures in the shallow trenches; and forming word-line structures, the word-line structures extending in a second direction and sequentially passing through the shallow trench isolation structures and the active regions.

9 Claims, 10 Drawing Sheets

SEMICONDUCTOR DEVICES AND PREPARATION METHODS THEREOF

CROSS-REFERENCE TO RELATED APPLICATIONS

This application is a national stage of International Application No. PCT/CN2021/096950 filed on May 28, 2021, which claims priority to Chinese Patent Application No. 202011215879.3, filed on Nov. 4, 2020. The disclosures of the above-referenced applications are hereby incorporated by reference in their entirety.

TECHNICAL FIELD

The present disclosure relates to, but is not limited to, a semiconductor device and a preparation method thereof.

BACKGROUND

With the high integration of semiconductors, more and more advanced processes have been applied to the semiconductor manufacturing process. With the evolution of Moore's Law to the 1xnm level, the active regions are required to be more densely arranged. The novel 3*2 structure makes the layout of the storage cells closer to the densest packing through the staggered arrangement of the active regions.

However, it is exactly such a layout of staggered arrangement of active regions that causes the word-line (WL) to periodically pass through the region between two active regions in a set direction. FIG. 1 is a schematic view of the distribution of active regions and word-lines of a conventional semiconductor device. Referring to FIG. 1, in the ART direction as the set direction (that is, the extension direction of the word-line 10), the word-line 10 periodically passes through the region A between two active regions 11. The word-line passing through the region A is called the passing word-line (Passing WL). When a word-line is turned on, in addition to affecting the active regions that the word-line passes through, PN junctions will be induced with the word-lines that are not turned on in the neighboring active regions at the position of the passing word-line (i.e., the region A), resulting in parasitic capacitance to cause junction leakage (junction leakage) which in turn leads to the decrease in the product yield.

SUMMARY

The following is a summary of the subject matter detailed herein. This summary is not intended to limit the protection scope defined by the claims.

The present disclosure provides a semiconductor device and a preparation method thereof, which can reduce or eliminate junction leakage and improve the yield of semiconductor devices. The present disclosure provides a preparation method for semiconductor device, comprising: providing a semiconductor substrate, the semiconductor substrate having shallow trenches and active regions defined by the shallow trenches, the active regions extending in a first direction; forming isolation layers in the first direction at interfaces between the shallow trenches and the active regions, the isolation layers and the active regions being inverse types to each other; forming shallow trench isolation structures in the shallow trenches; and forming word-line structures, the word-line structures extending in a second direction and sequentially passing through the shallow trench isolation structures and the active regions.

The isolation layers are formed in the active regions at the interfaces.

According to some embodiments of the present disclosure, the isolation layers are formed in the active regions by an ion implantation process.

According to some embodiments of the present disclosure, the method of forming the shallow trenches in the substrate comprises:
forming a patterned mask layer on the substrate; and by using the mask layer as a mask, transferring the pattern of the mask layer to the substrate to form shallow trenches on the substrate.

According to some embodiments of the present disclosure, the step of forming isolation layers in the first direction at interfaces between the shallow trenches and the active regions comprises: forming isolating material layer on the inner wall of the shallow trenches and the surface of the mask layer; and removing the isolating material layer and the mask layer on the surface of the mask layer, leaving only the isolating material layer at the interfaces between the shallow trenches and the active regions in one direction as the isolation layers.

According to some embodiments of the present disclosure, the first direction and the second direction form an acute angle.

The present disclosure further provides a semiconductor device, comprising: a semiconductor substrate, the semiconductor substrate having shallow trenches and active regions defined by the shallow trenches, the active regions extending in a first direction; shallow trench isolation structures, arranged in the shallow trenches; isolation layers, arranged in the first direction at interfaces between the shallow trenches and the active regions, the isolation layers and the active regions being inverse types to each other; and word-line structures, the word-line structures extending in a second direction and sequentially passing through the shallow trench isolation structures and the active regions.

According to some embodiments of the present disclosure, the isolation layers are formed in the active regions at interfaces between the shallow trench isolation structures and the active regions.

According to some embodiments of the present disclosure, the first direction and the second direction form an acute angle.

The isolation layers and the active regions form PN junctions to prevent current leakage.

In the present disclosure, isolation layers are formed at the interfaces between the shallow trenches and the active regions. The isolation layers and the active regions are inverse types to each other, so that the isolation layers and the active regions form PN junctions. After the word-line structure is turned on, the PN junction can form built-in electric field to avoid the formation of PN junctions between the turned on word-line structure and the word-lines that are not turned on in the neighboring active regions 320, thereby avoiding the parasitic capacitance and thus avoiding the current leakage. Therefore, the electrical performance of semiconductor devices is greatly improved and the yield of semiconductor devices is improved.

After reading and understanding the drawings and detailed description, other aspects may be understood.

BRIEF DESCRIPTION OF THE DRAWINGS

The accompanying drawings, which are incorporated in and form a part of this specification, illustrate embodiments of the present disclosure and explain, together with the description, the principles of the present disclosure. In these drawings, like reference numerals identify like elements. The drawings to be described below are some, but not all, embodiments of the present disclosure. Other drawings may be obtained by a person of ordinary skill in the art in accordance with those drawings without paying any creative effort.

Figure 1:
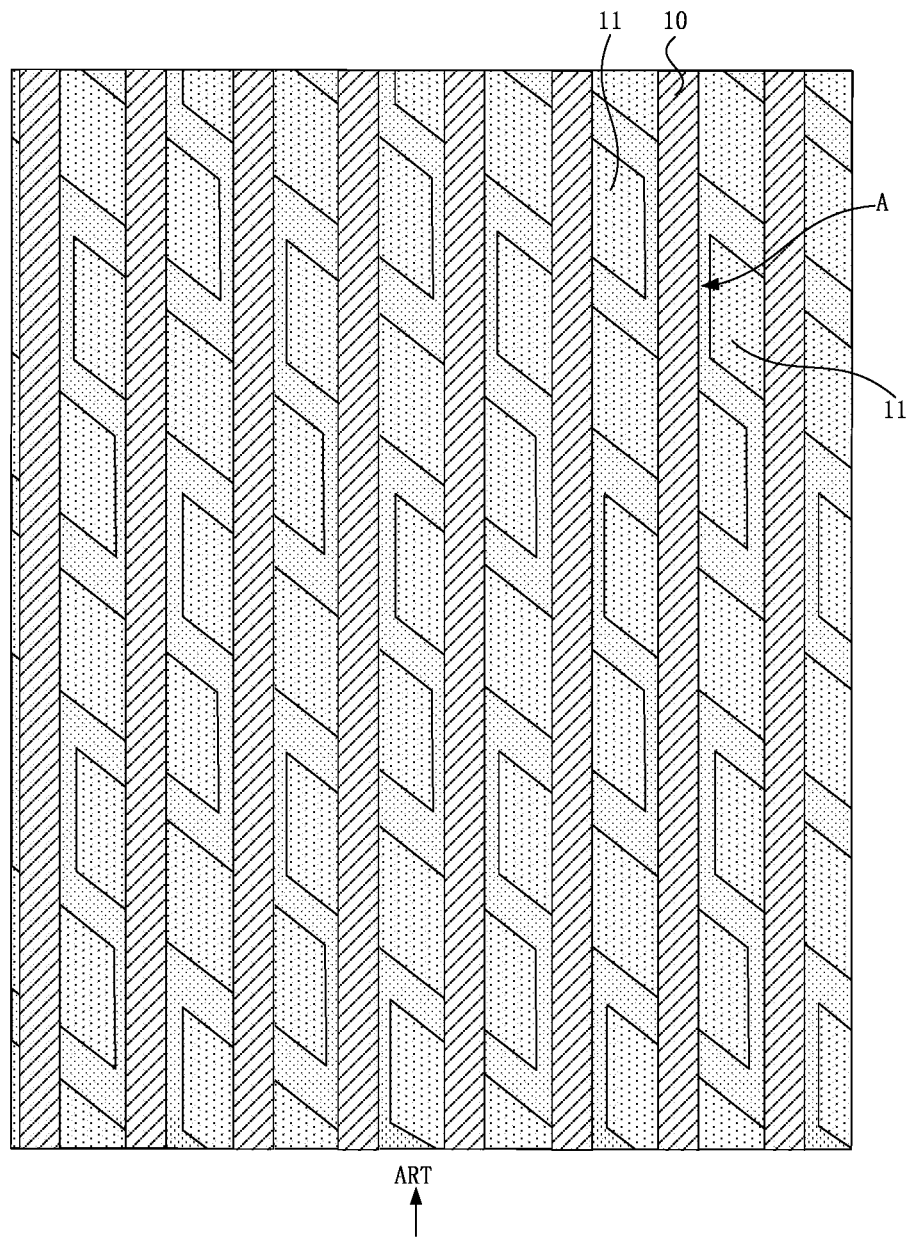
FIG. 1 is a schematic view of the distribution of active regions and word-lines of a conventional semiconductor device.

REFERENCE NUMERALS (300, 500): semiconductor substrate; (340, 540): shallow trench isolation structure; (330, 530): isolation layer; (350, 350-1, 350-2, 550, 550-1, 550-2): word-line structure; (351, 551): first part; (352,552): second part, (320, 520): active region; 310: shallow trenches; (360,560): passivation layer; 400: mask layer; 410: isolating material layer.

DETAILED DESCRIPTION

To make the purposes, technical solutions and advantages of the embodiments of the present disclosure clearer, the technical solutions in the embodiments of the present disclosure will be described clearly and completely with reference to the drawings in the embodiments of the present disclosure. Apparently, the embodiments to be described are some, but not all, embodiments of the present disclosure. Based on the embodiments of the present disclosure, all other embodiments obtained by a person of ordinary skill in the art without paying any creative effort should be included in the protection scope of the present disclosure. It is to be noted that the embodiments of the present disclosure and features in the embodiments may be combined if not conflict.

Figure 2:
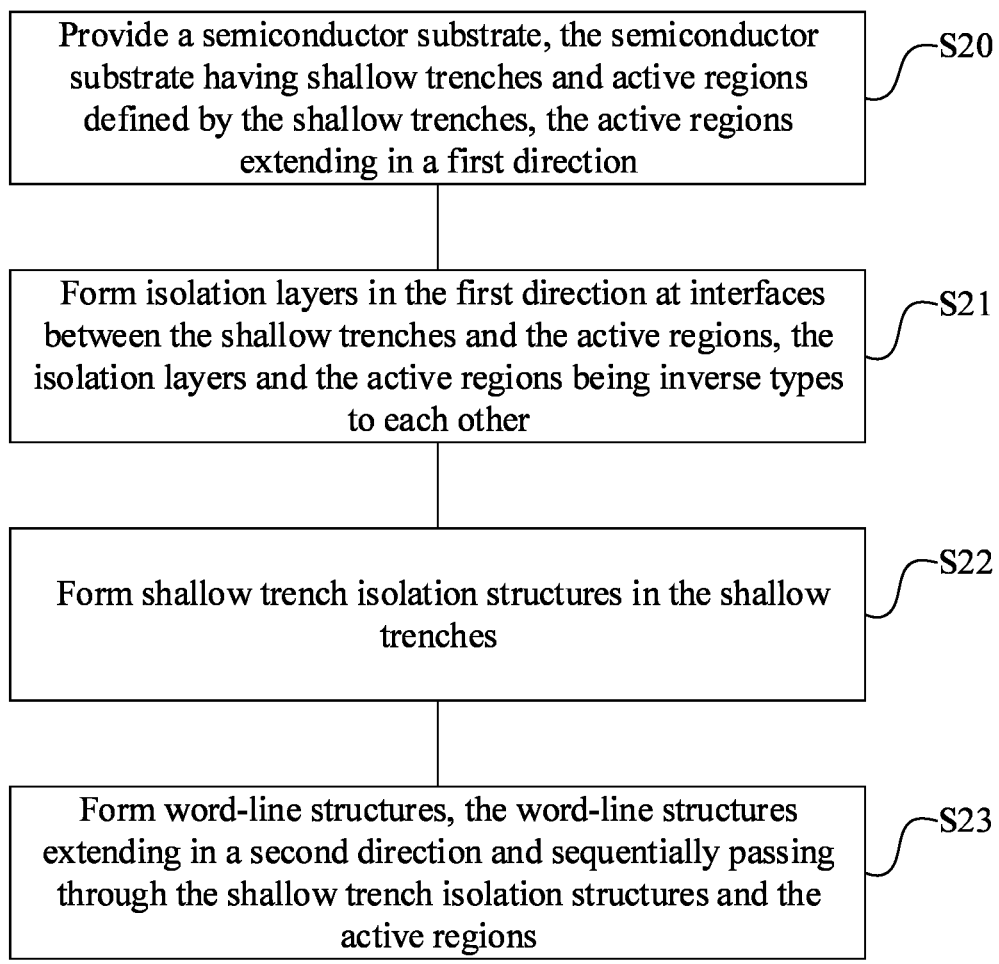
FIG. 2 is a schematic view of steps of a preparation method for semiconductor device according to an embodiment of the present disclosure.

FIG. 2 is a schematic view of steps of a preparation method for semiconductor device according to an embodiment of the present disclosure. Referring to FIG. 2, the preparation method comprises: a step S20 of providing a semiconductor substrate, the semiconductor substrate having shallow trenches and active regions defined by the shallow trenches, the active regions extending in a first direction (the ARZ direction as shown in FIG. 3A); a step S21 of forming isolation layers in the first direction at interfaces between the shallow trenches and the active regions, the isolation layers and the active regions being inverse types to each other; a step S22 of forming shallow trench isolation structures in the shallow trenches; and a step S23 of forming word-line structures, the word-line structures extending in a second direction (the ART direction as shown in FIG. 3G) and sequentially passing through the shallow trench isolation structures and the active regions.

FIGS. 3A-3I are process flowcharts of a preparation method for semiconductor device according to an embodiment of the present disclosure.

Figure 3A:
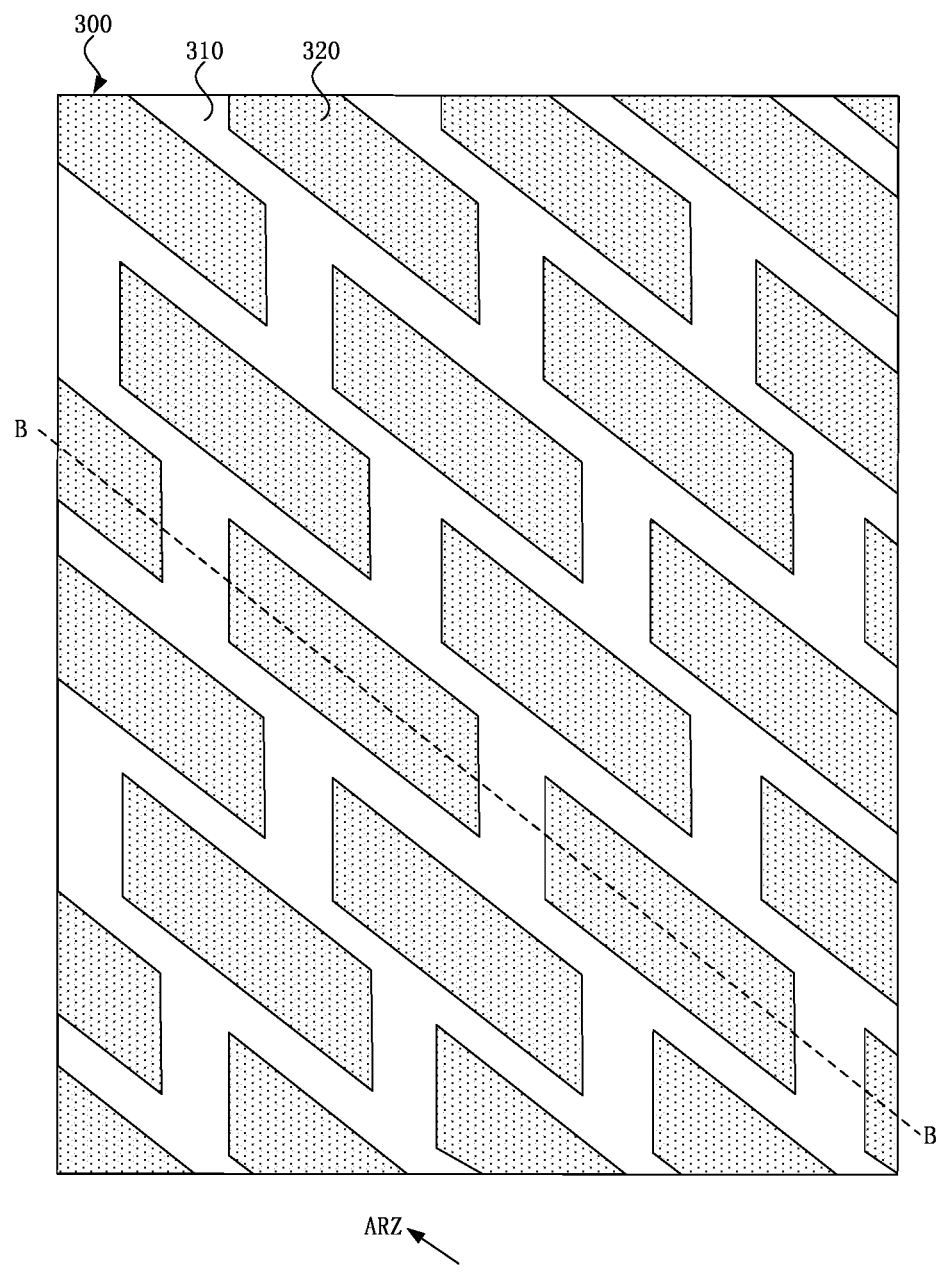
FIG. 3A is a top view of a semiconductor device, with the mask layer removed, according to an embodiment of the present disclosure.
Figure 3B:
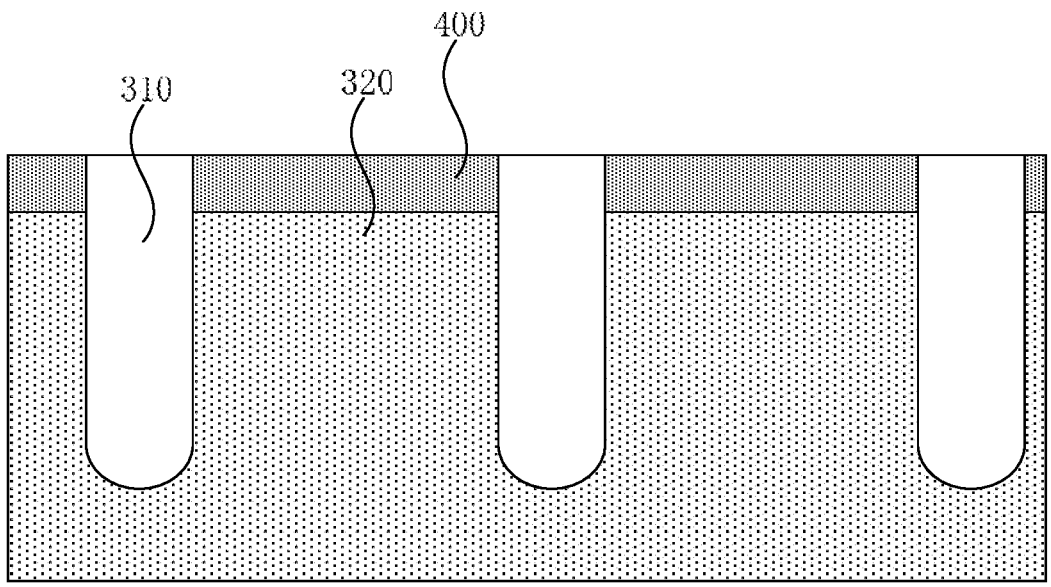
FIG. 3B is a schematic cross-sectional structure diagram of part B-B of FIG. 3A.

Referring to the step S20, FIG. 3A and FIG. 3B, wherein FIG. 3A is a top view and FIG. 3B is a cross-sectional view taken in line BB of FIG. 3A, a semiconductor substrate 300 is provided. The semiconductor substrate 300 has shallow trenches 310 and active regions 320 defined by the shallow trenches 310. The active regions 320 extend in a first direction.

The semiconductor substrate 300 may be a monocrystalline silicon substrate, a Ge substrate, a SiGe substrate, SOI or GOI, etc. According to the actual requirements of the device, a suitable semiconductor material may be selected as the semiconductor substrate 300. The material for the semiconductor substrate is not limited here. In this embodiment, the semiconductor substrate 300 is a monocrystalline silicon substrate.

In this embodiment, the shallow trenches 310 are formed in the semiconductor substrate 300 by photolithography and etching processes. The regions between the shallow trenches 310 are the active regions 320. The active regions 320 extend in the first direction (the ARZ direction as shown in FIG. 3A). That is, the first direction is a direction parallel to the direction of the active regions 320.

Some embodiments of the present disclosure further provide a method of forming the shallow trenches 310. Specifically, a patterned mask layer 400 are formed on the substrate 300. FIG. 3A is a top view after the mask layer 400 is removed. The mask layer 400 may be a single-layer structure or a multi-layer structure. It may be a conventional structure used in semiconductor processes. By using the mask layer 400 as a mask, the pattern of the mask layer 400 is transferred to the substrate 300 to form shallow trenches 310 on the substrate 300. The method of transferring, by using the mask layer 400 as a mask, the pattern of the mask layer 400 to the substrate 300 may be etching. After the pattern of the mask layer 400 is transferred to the substrate 300, the mask layer 400 may be directly removed to form a semiconductor substrate 300 with only the shallow trenches 310, or the mask layer 400 may be removed after isolation layers 330 are formed (see FIG. 3D). In some embodiments of the present disclosure, the mask layer 400 is removed after the isolation layers 330 are formed.

Figure 3C:
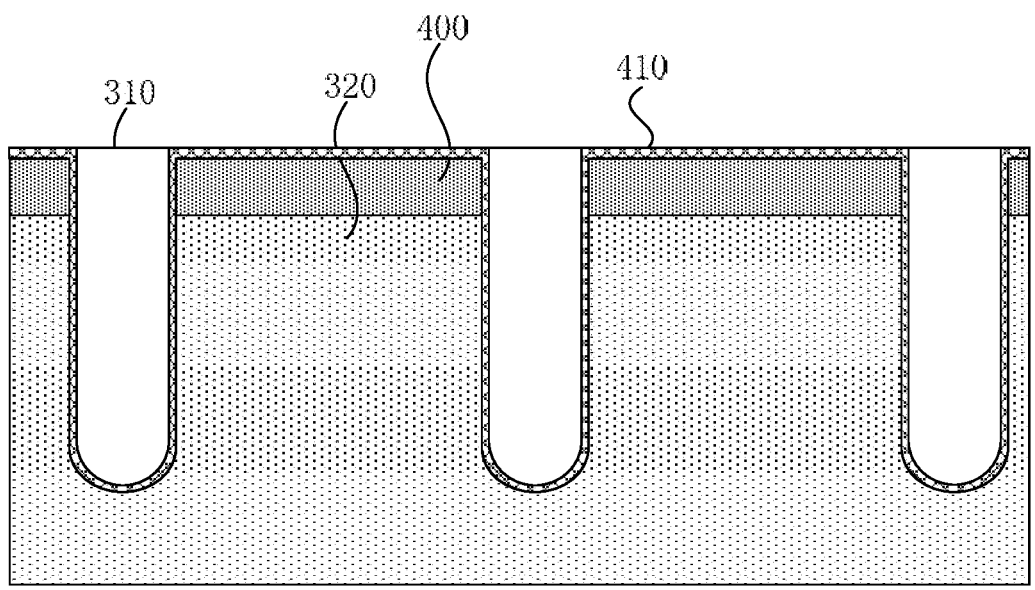
FIG. 3C is a schematic cross-sectional structure diagram of a semiconductor device, with isolating material layer formed on the inner wall of the shallow trenches and the surface of the mask layer, according to an embodiment of the present disclosure.
Figure 3D:
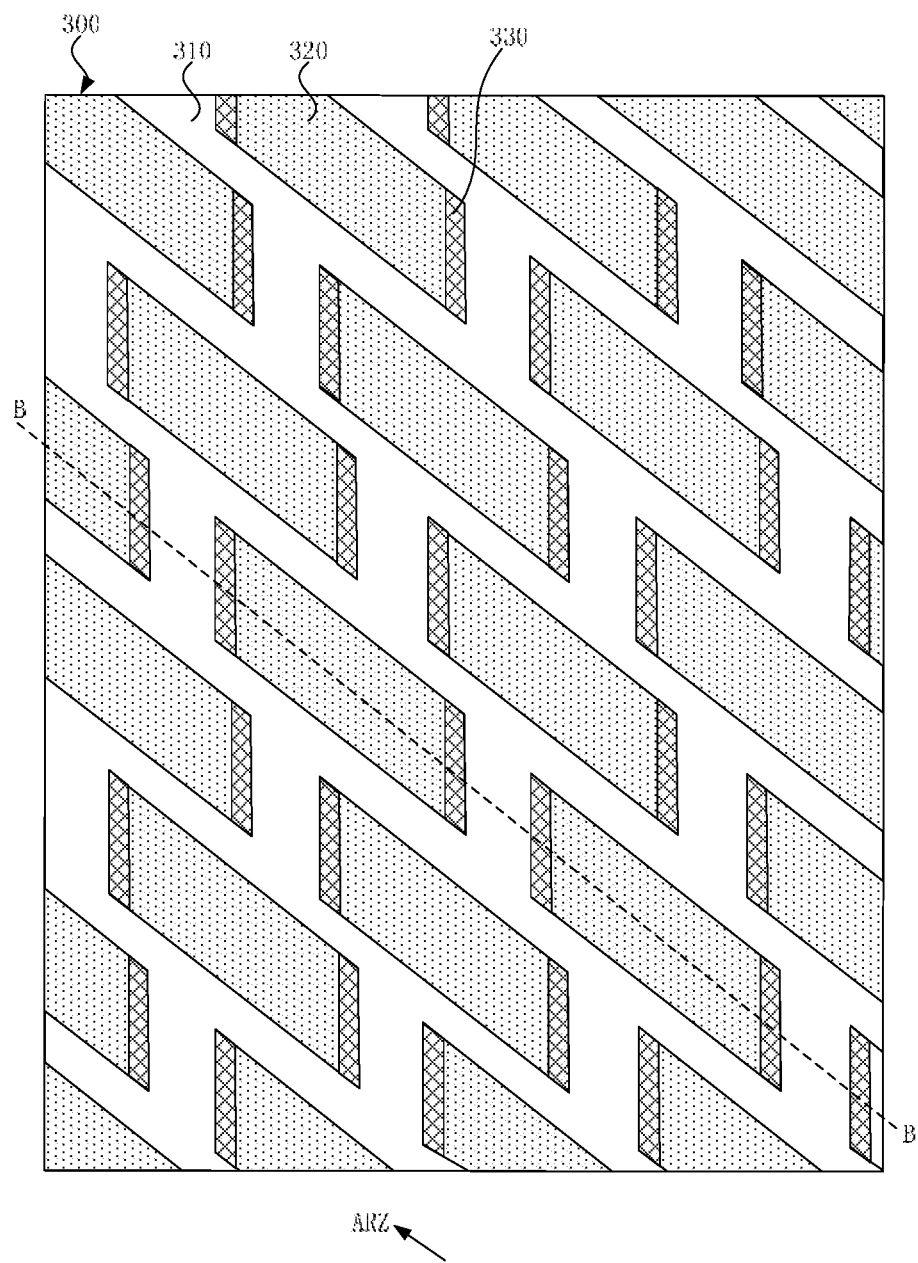
FIG. 3D is a top view of a semiconductor device, with the mask layer and part of the isolating material layer removed, according to an embodiment of the present disclosure.
Figure 3E:
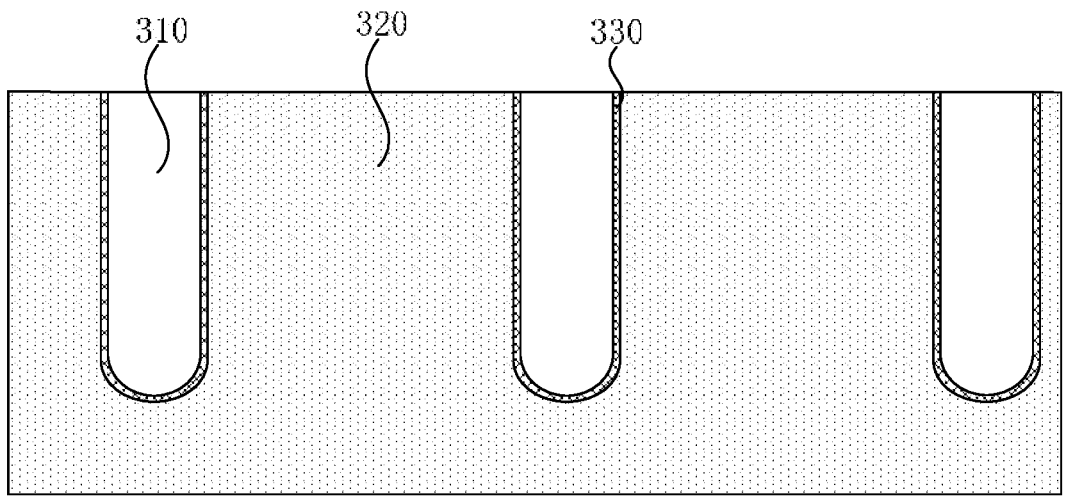
FIG. 3E is a schematic cross-sectional structure diagram of part B-B of FIG. 3D.

Referring to the step S21, FIG. 3C, FIG. 3D, and FIG. 3E, isolation layers 330 are formed in the first direction at interfaces between the shallow trenches 310 and the active regions 320. The isolation layers 330 and the active regions 320 are inverse types to each other.

Specifically, in this step, the isolation layers 330 are formed only at the interfaces between the shallow trenches 310 and the active regions 320 in the first direction (the ARZ direction as shown in FIG. 3D). The isolation layers 330 are not formed at the interfaces between the shallow trenches 310 and the active regions 320 in other directions. The interfaces between the shallow trenches 310 and the active regions 320 in the first direction corresponds to the second parts 352 (see FIG. 3G) of the subsequently formed word-line structures 350 (see FIG. 3G).

The isolation layers 330 and the active regions 320 are inverse types to each other. That is, the conductivity type of the isolation layers 330 and the conductivity type of the active regions 320 are inverse types to each other. For example, if the conductivity type of the isolation layers 330 is P-type, the conductivity type of the active regions 320 is N-type; and if the conductivity type of the isolation layers 330 is N-type, the conductivity type of the active regions 320 is P-type. In some embodiments of the present disclosure, the conductivity type of the isolation layers 330 is N-type, and the conductivity type of the active regions 320 is P-type.

The conductivity type of the isolation layers 330 and of the active regions 320 depends upon the type of dopants. Taking the active regions 320 as an example, if the semiconductor substrate 300 is doped with phosphorus (P), arsenic (As) or other suitable n-type dopants, the conductivity type of the active regions 320 is N-type; and if the semiconductor substrate 300 is doped with boron (B), gallium (Ga) or other suitable p-type dopants, the conductivity type of the active regions 320 is P-type.

The isolation layers 330 are formed by ion implanting the active regions 320 (that is, the sidewall of the shallow trenches 310) at the interfaces between the shallow trenches 310 and the active regions 320 in the first direction. In this embodiment, the conductivity type of the active regions 320 is P-type, then the active regions 320 (that is, the sidewall of the shallow trenches 310) at the interfaces between the shallow trenches 310 and the active regions 320 are implanted with n-type dopants in the first direction by an ion implantation process to form isolation layers 330 having a conductivity type of N-type. In other embodiments of the present disclosure, the conductivity type of the active regions 320 is N-type, then the active regions 320 (that is, the sidewall of the shallow trenches 310) at the interfaces between the shallow trenches 310 and the active regions 320 are implanted with P-type dopants in the first direction by an ion implantation process to form isolation layers 330 having a conductivity type of P-type.

The thickness of the isolation layers 330 may be determined according to the actual process. In some embodiments, the isolation layers 330 cannot be too thick to avoid affecting the effective area of the active regions.

This embodiment further provides a method of forming the isolation layers 330. The method specifically comprises the following steps.

Referring to FIG. 3C, isolating material layer 410 is formed on the inner wall of the shallow trenches 310 and the surface of the mask layer 400. The isolating material layer 410 may be formed by an ion implantation process. The conductivity type of the isolating material layer 410 and the conductivity type of the active regions 320 are inverse types to each other.

Referring to FIGS. 3D and 3E, wherein FIG. 3D is a top view and FIG. 3E is a cross-sectional view taken in line BB of FIG. 3D. The isolating material layer 410 on the surface of the mask layer 400 and the mask layer 400 are removed, leaving only the isolating material layer 410 at the interfaces between the shallow trenches 310 and the active regions 320 in the first direction as the isolation layers 330. The isolating material layer 410 on the surface of the mask layer 400 and the mask layer 400 may be sequentially removed by an etching process to expose the surface of the active regions 320.

In this step, since the isolation layers 330 are located at the interfaces between the shallow trenches 310 and the active regions 320, and the isolation layers 330 and the active regions 320 are inverse types to each other, the isolation layers 330 and the active regions 320 form PN junctions in the first direction (the ARZ direction as shown in FIG. 3D).

Figure 3F:
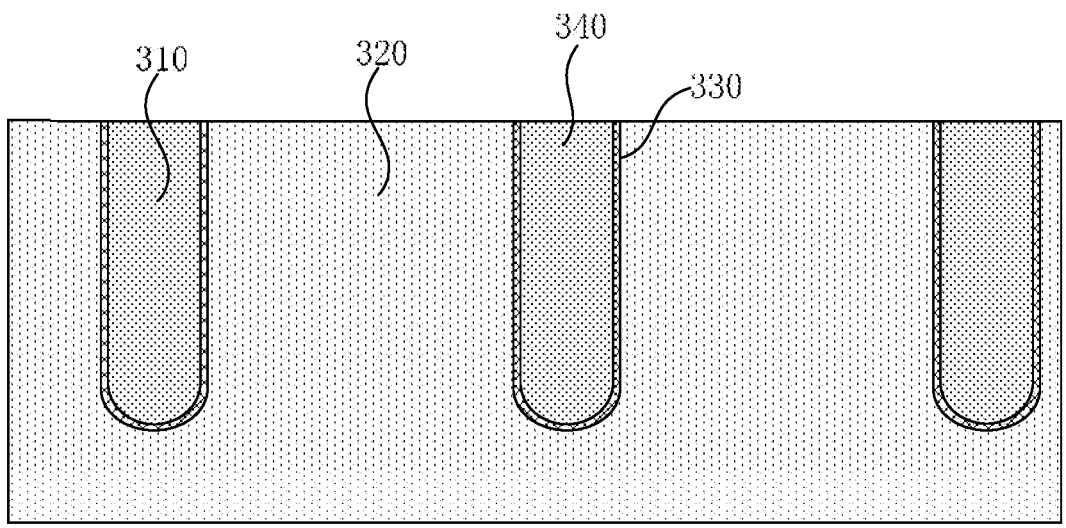
FIG. 3F is a schematic cross-sectional structure diagram of a semiconductor device, with shallow trench isolation structures formed in shallow trenches, according to an embodiment of the present disclosure.
Figure 3G:
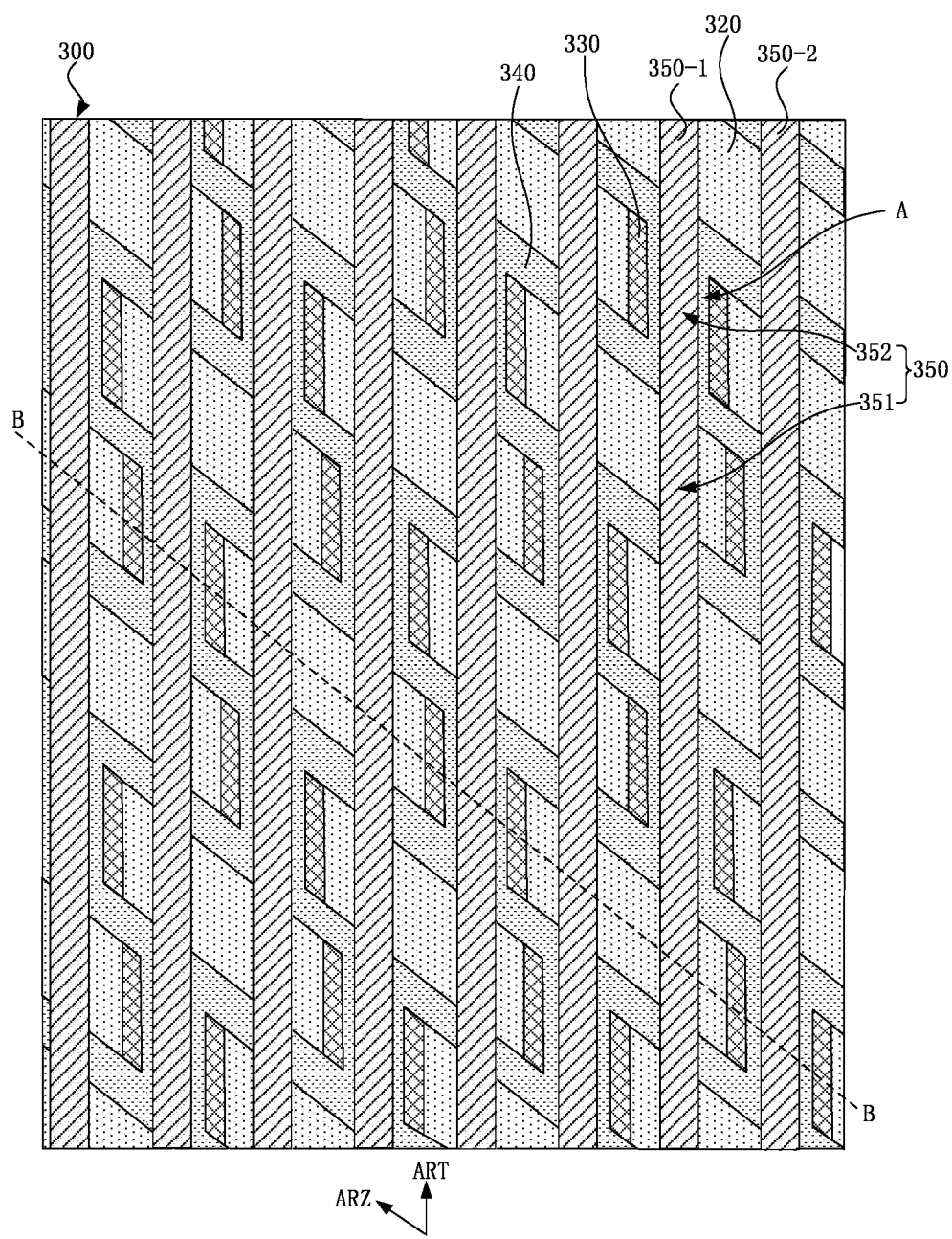
FIG. 3G is a schematic structure diagram of a semiconductor device, with word-line structures formed, when viewed from the top, according to an embodiment of the present disclosure.

Referring to the step S22 and FIG. 3F, shallow trench isolation structures 340 are formed in the shallow trenches 310. The shallow trench isolation structures 340 may be an oxide, for example silicon oxide, which can effectively isolate different active regions 320. In this step, the method for forming the shallow trench isolation structures 340 in the shallow trenches 310 specifically comprises: depositing an oxide material layer which fills the shallow trenches 310 and covers the surface of the active regions 320; and removing part of the oxide material layer, leaving only the oxide material layer in the shallow trenches 310 to form the shallow trench isolation structures 340. In the shallow trenches 310, the shallow trench isolation structures 340 cover the isolation layers 330.

Figure 3H:
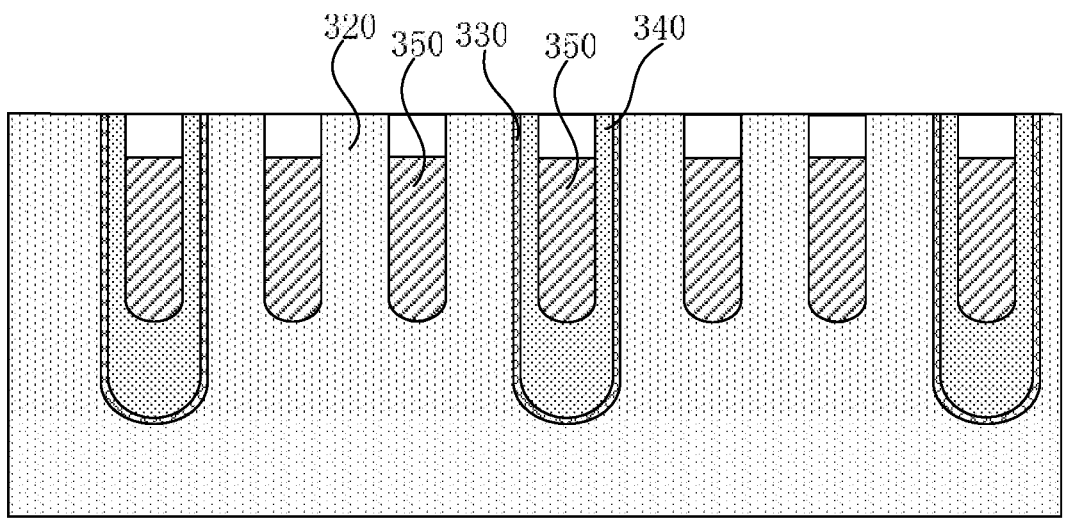
FIG. 3H is a schematic cross-sectional structure diagram of part B-B of FIG. 3G.
Figure 3I:
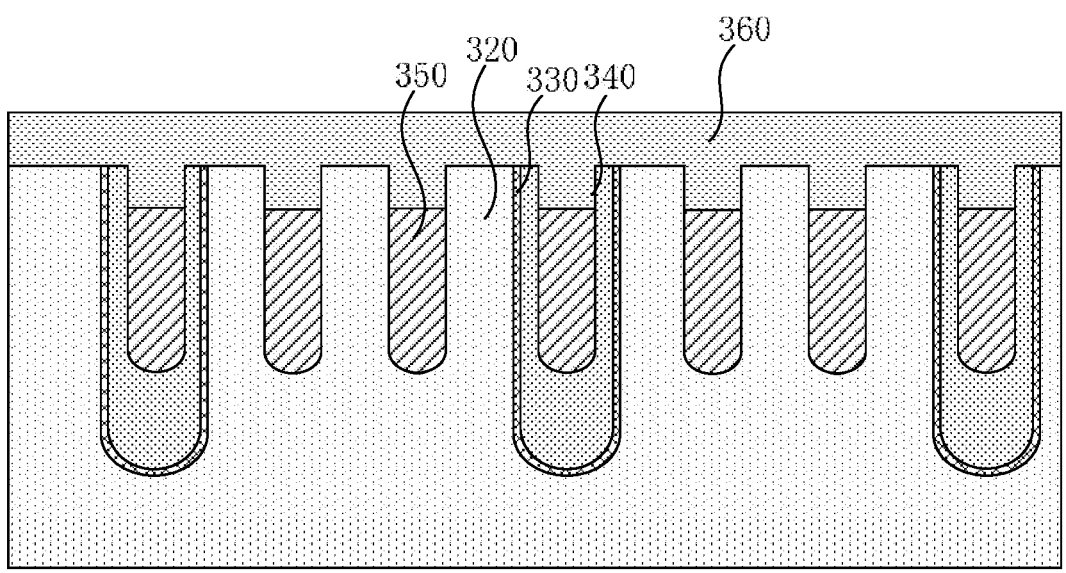
FIG. 3I is a schematic cross-sectional structure diagram of a semiconductor device, with a passivation layer formed, according to an embodiment of the present disclosure.

Referring to the step S23, FIG. 3G and FIG. 3H, wherein FIG. 3G is a top view and FIG. 3H is a cross-sectional view taken in line BB of FIG. 3G, word-line structures 350 are formed. The word-line structures 350 extend in the second direction and sequentially passes through the shallow trench isolation structures 340 and the active regions 320.

In this step, word-line trenches may be formed in the semiconductor substrate 300 first, and the word-line trenches may be filled to form the word-line structures 350. The word-line structures 350 and the forming method thereof are conventional technologies, and will not be described in detail here.

The word-line structures 350 extend in the second direction (the ART direction as shown in FIG. 3G), and sequentially passes through the shallow trench isolation structures 340 and the active regions 320. The word-line structures 350 may be divided into first parts 351 and second parts 352 according to their passing route. The first parts 351 are parts passing through the active regions 320, which will be subsequently used as the gate of the device. The second parts are parts passing through the region A between two adjacent active regions 320, which pass through the word-line. The first parts 351 and the second parts 352 are alternately arranged in the extension direction of the word-line structures 350. The first direction (the ARZ direction as shown in FIG. 3G) and the second direction (the ART direction as shown in FIG. 3G) form an acute angle. The angle between the first direction and the second direction may be set according to actual processes, and may be determined by the preparation process of the active regions.

In the region A, the second parts 352 of the word-line structures corresponds to the isolation layers 330. In the first direction (the ARZ direction as shown in FIG. 3G), the isolation layers 330 are located between the active regions 320 and the second parts 352 of the word-line structures 350. Then, when the word-line structures passing through the region A are turned on, the PN junctions formed by the isolation layer 330 and the active region 320 form built-in electric field, which can prevent the flowing of electrons to the active regions 320 caused by the turn-on of the word-line structures 351. Thus, the formation of PN junctions between the second parts 352 of the word-line structures 350 and the word-line structures that are not turned on in the neighboring active regions 320 is avoided, thereby avoiding the parasitic capacitance and thus avoiding the current leakage. Therefore, the electrical performance of semiconductor devices is greatly improved.

For example, still referring to FIG. 3G, taking the word-line structure 350-1 and the word-line structure 350-2 as an example, the word-line structure 350-1 extends in the ART direction and sequentially passes through the shallow trench isolation structures 340 and the active regions 320, the word-line structure 350-2 extends in the ART direction and sequentially passes through the shallow trench isolation structures 340 and the active regions 320. When the word-line structure 350-1 is turned on and the word-line structure 350-2 is not turned on, in the region A where the second part of the word-line structure 350-1 passes through, the PN junction formed by the isolation layer 330 and the active region 320 forms a built-in electric field, which can prevent the flowing of electrons to the active region 320 caused by the turn-on of the word-line structure 350-1. Thus, the formation of PN junction between the second part 352 of the word-line structure 350-1 and the first part 351 of the word-line structure 350-2 is avoided, thereby avoiding the parasitic capacitance and thus avoiding the current leakage. Therefore, the electrical performance of semiconductor devices is greatly improved.

In some embodiments of the present disclosure, after forming the word-line structures, the method further comprises a step of forming a passivation layer. Specifically, referring to FIG. 3I, a passivation layer 360 is formed, and the passivation layer 360 covers the surface of the word-line structures 350 and the surface of the shallow trench isolation structures 340. The passivation layer 360 may be a nitride layer, for example a silicon nitride layer.

By the preparation method for semiconductor device according to the present disclosure, isolation layers are formed at the interfaces between the shallow trenches and the active regions. The isolation layers and the active regions are inverse to each other, so that the isolation layers and the active regions form PN junctions. After the word-line structures are turned-on, the PN junctions can form built-in electric field to avoid the formation of PN junctions between the turned-on word-line structures and the word-lines that are not turned-on in the neighboring active regions 320, thereby avoiding the parasitic capacitance and thus avoiding the current leakage. Therefore, the electrical performance of semiconductor devices is greatly improved and the yield of semiconductor devices is improved.

Figure 4:
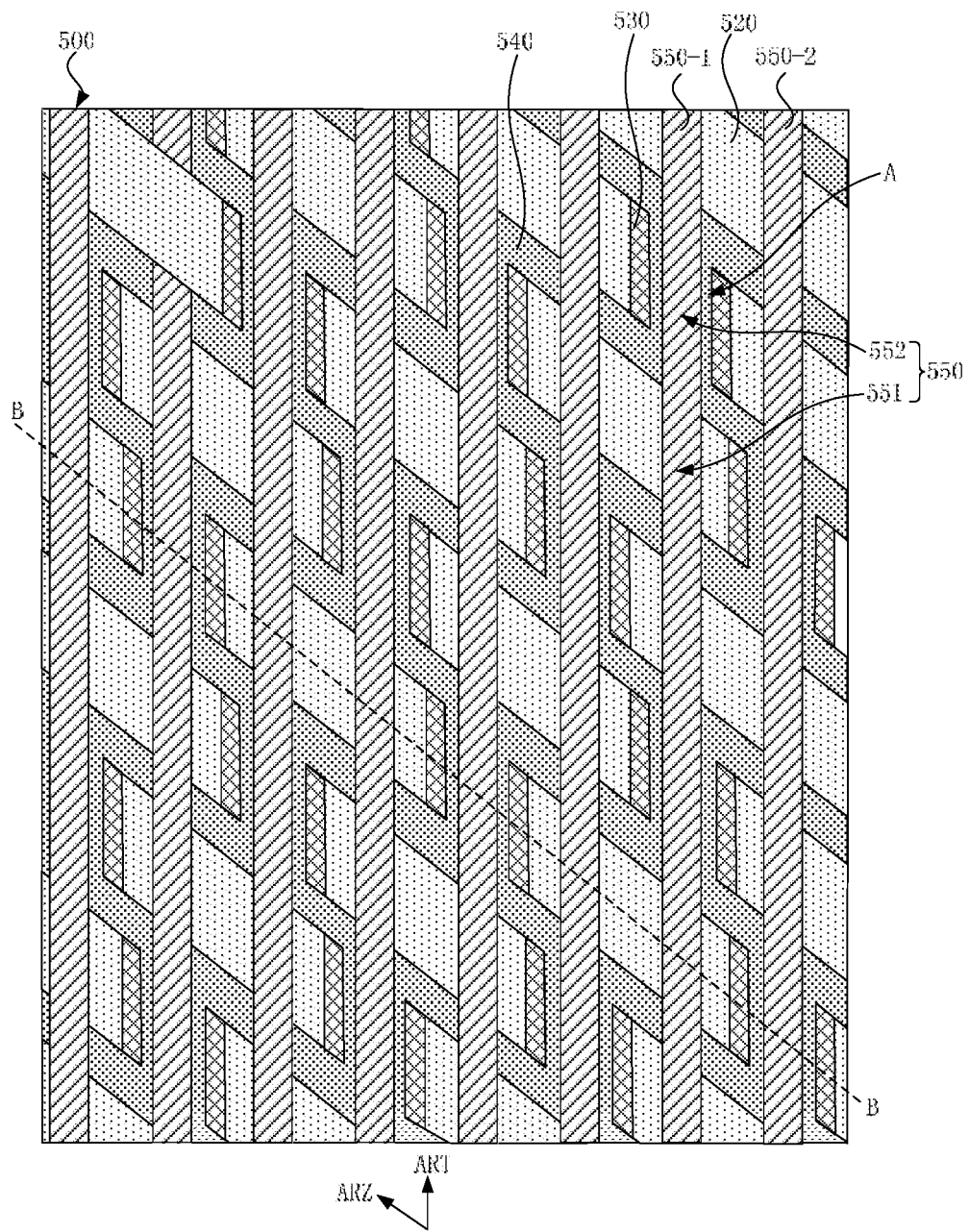
FIG. 4 is a schematic top view of a semiconductor device according to an embodiment of the present disclosure.
Figure 5:
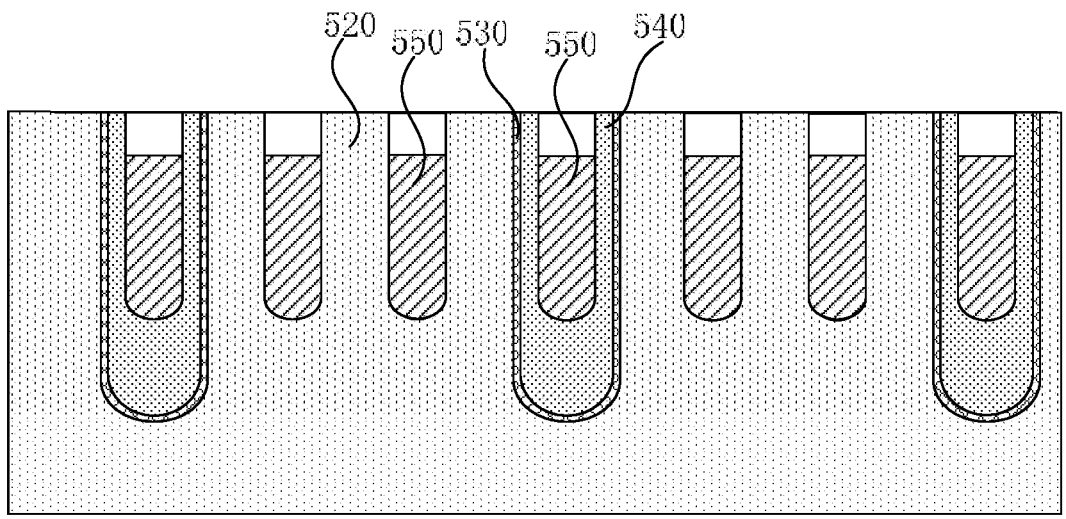
FIG. 5 is a cross-sectional view taken in line B-B of FIG. 4.

The present disclosure further provides a semiconductor device which is prepared by the preparation method described above. FIG. 4 is a schematic top view of a semiconductor device according to an embodiment of the present disclosure. FIG. 5 is a cross-sectional view taken in line BB of FIG. 4. Referring to FIGS. 4 and 5, the semiconductor device comprises a semiconductor substrate 500, shallow trench isolation structures 540, isolation layers 530 and word-line structures 550.

The semiconductor substrate 500 may be a monocrystalline silicon substrate, a Ge substrate, a SiGe substrate, SOI or GOI, etc. According to the actual requirements of the device, a suitable semiconductor material may be selected as the semiconductor substrate 300. The material for the semiconductor substrate is not limited here. In this embodiment, the semiconductor substrate 500 is a monocrystalline silicon substrate.

The semiconductor substrate 500 has shallow trenches and active regions 520 defined by the shallow trenches. The active regions 520 extend in a first direction. Specifically, the active regions 520 extend in the first direction (the ARZ direction as shown in FIG. 4). That is, the first direction is a direction parallel to the direction of the active regions 520.

The shallow trench isolation structures 540 are arranged in the shallow trenches. The shallow trench isolation structures 540 may be an oxide, for example silicon oxide, which can effectively isolate different active regions 520.

In the first direction, the isolation layers 530 are arranged at the interfaces between the shallow trench isolation structures 540 and the active regions 520. Specifically, in some embodiments of the present disclosure, in the ARZ direction, the isolation layers 530 are located between the shallow trench isolation structures 540 and the active regions 520. Further, in some embodiments of the present disclosure, at the interfaces between the shallow trench isolation structures 540 and the active regions 520, the isolation layers 530 are formed in the active regions 520. For example, at the interfaces between the shallow trench isolation structures 540 and the active regions 520, ion implantation is performed to the active regions 520 to form the isolation layers 530, so that the isolation layers 530 are formed in the active regions 520.

The isolation layers 530 and the active regions 520 are inverse types to each other, so the isolation layers 530 and the active regions 520 can form PN junctions. For example, if the conductivity type of the isolation layers 530 is P-type, the conductivity type of the active regions 520 is N-type, and the isolation layers 530 and the active regions 520 can form PN junctions; and if the conductivity type of the layer 530 is N-type, the conductivity type of the active regions 520 is P-type, and the isolation layers 530 and the active regions 520 can form PN junctions. In some embodiments of the present disclosure, the conductivity type of the isolation layers 530 is N-type, the conductivity type of the active regions 520 is P-type, and the isolation layers 530 and the active regions 520 can form PN junctions.

The word-line structures 550 extend in the second direction and sequentially passes through the shallow trench isolation structures 540 and the active regions 520. Specifically, the word-line structures 550 extend in the second direction (the ART direction as shown in FIG. 4), and sequentially passes through the shallow trench isolation structures 540 and the active regions 520.

The word-line structures 550 may be divided into first parts 551 and second parts 552 according to its passing route. The first parts 551 are parts passing through the active regions 520, which will be subsequently used as the gate of the device. The second parts 552 are parts passing through the region A between two adjacent active regions 520, which pass through the word-line. The first parts 551 and the second parts 552 are alternately arranged in the extension direction of the word-line structures 550. The first direction (the ARZ direction as shown in FIG. 4) and the second direction (the ART direction as shown in FIG. 4) form an acute angle. The angle between the first direction and the second direction may be set according to actual processes, and may be determined by the preparation process of the active regions.

In the region A, the second parts 552 of the word-line structures corresponds to the isolation layers 530. In the first direction (the ARZ direction as shown in FIG. 4), the isolation layers 530 are located between the active regions 520 and the second parts 552 of the word-line structures 550. Then, when the word-line structure passing through the region A is turned on, the PN junction formed by the isolation layer 530 and the active region 520 forms built-in electric field, which can prevent the flowing of electrons to the active region 520 caused by the turn-on of the word-line structure 551. Thus, the formation of PN junctions between the second parts 552 of the word-line structures 550 and the word-line structures that are not turned on in the neighboring active regions 520 is avoided, thereby avoiding the parasitic capacitance and thus avoiding the current leakage. Therefore, the electrical performance of semiconductor devices is greatly improved.

For example, still referring to FIG. 4, taking the word-line structure 550-1 and the word-line structure 550-2 as an example, the word-line structure 550-1 extends in the ART direction and sequentially passes through the shallow trench isolation structures 540 and the active regions 520, the word-line structure 550-2 extends in the ART direction and sequentially passes through the shallow trench isolation structures 540 and the active regions 520. When the word-line structure 550-1 is turned on and the word-line structure 550-2 is not turned on, in the region A where the second part of the word-line structure 550-1 passes through, the PN junction formed by the isolation layer 530 and the active region 520 forms a built-in electric field, which can prevent the flowing of electrons to the active region 520 caused by the turn-on of the word-line structure 550-1. Thus, the formation of PN junction between the second part 552 of the word-line structure 550-1 and the first part 551 of the word-line structure 550-2 is avoided, thereby avoiding the parasitic capacitance and thus avoiding the current leakage. Therefore, the electrical performance of semiconductor devices is greatly improved.

Figure 6:
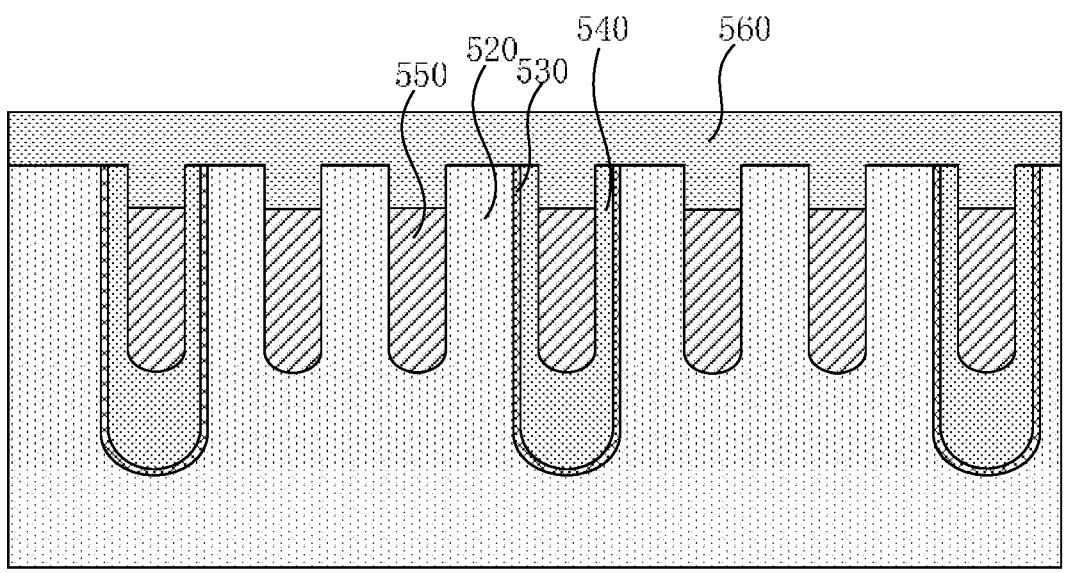
FIG. 6 is a schematic cross-sectional structure diagram of a semiconductor device according to another embodiment of the present disclosure.

Further, in another embodiment of the present disclosure, referring to FIG. 6, which is a schematic cross-sectional structure diagram of a semiconductor device according to another embodiment of the present disclosure. The semiconductor device further comprises a passivation layer 560, which covers the surface of the word-line structures 550 and the surface of the shallow trench isolation structures 540 and is used to protect the word-line structures 550 and the shallow trench isolation structures 540. The passivation layer 560 may be a nitride layer, for example a silicon nitride layer.

The semiconductor device according to the present disclosure uses the PN junctions formed by the isolation layers 530 and the active regions 520 to block the flowing of electrons, thereby avoiding the parasitic capacitance and thus avoiding the current leakage. Therefore, the electrical performance of semiconductor devices is greatly improved and the yield of semiconductor devices is improved.

Those skilled in the art will readily think of other implementations of the present disclosure by considering the specification and practicing the disclosure disclosed herein. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

It should be understood that the present disclosure is not limited to the precise structures that have been described above and shown in the drawings, and various modifications and changes may be made without departing from its scope. The scope of the present disclosure is defined only by the appended claims.

Industrial Applicability

The present disclosure provides a semiconductor device and a preparation method thereof. The isolation layers and the active regions form PN junctions. After the word-line structure is turned on, the PN junction can form built-in electric field to avoid the formation of PN junctions between the turned on word-line structure and the word-lines that are not turned on in the neighboring active regions, thereby avoiding the parasitic capacitance and thus avoiding the current leakage. Therefore, the electrical performance of semiconductor devices is greatly improved and the yield of semiconductor devices is improved.

What is claimed is:

1. A preparation method for semiconductor device, comprising:
    providing a semiconductor substrate, the semiconductor substrate having shallow trenches and active regions defined by the shallow trenches, the active regions extending in a first direction;
    forming isolation layers in the first direction at interfaces between the shallow trenches and the active regions, the isolation layers and the active regions being inverse conductivity types to each other;
    forming shallow trench isolation structures in the shallow trenches; and
    forming word-line structures, the word-line structures extending in a second direction and sequentially passing through the shallow trench isolation structures and the active regions;
    wherein the first direction and the second direction form an acute angle.

2. The preparation method for semiconductor device according to claim 1, wherein
    the isolation layers are formed in the active regions at the interfaces.

3. The preparation method for semiconductor device according to claim 2, wherein
    the isolation layers are formed in the active regions by an ion implantation process.

4. The preparation method for semiconductor device according to claim 3, wherein
    a method of forming the shallow trenches in the substrate comprises:
    forming a patterned mask layer on the substrate; and
    by using the mask layer as a mask, transferring the pattern of the mask layer to the substrate to form shallow trenches on the substrate.

5. The preparation method for semiconductor device according to claim 4, wherein
    the step of forming isolation layers in the first direction at interfaces between the shallow trenches and the active regions comprises:
    forming isolating material layer on the inner wall of the shallow trenches and the surface of the mask layer; and removing the isolating material layer and the mask layer from a top surface of the substrate, leaving only the isolating material layer at the interfaces between the shallow trenches and the active regions in one direction as the isolation layers.

6. The preparation method for semiconductor device according to claim 1, further comprising:
forming a passivation layer, the passivation layer covering the surface of the word-line structures and the surface of the shallow trench isolation structures.

7. A semiconductor device, comprising:
a semiconductor substrate, the semiconductor substrate having shallow trenches and active regions defined by the shallow trenches, the active regions extending in a first direction;
shallow trench isolation structures, arranged in the shallow trenches;
isolation layers, arranged in the first direction at interfaces between the shallow trenches and the active regions, the isolation layers and the active regions being inverse conductivity types to each other; and
word-line structures, the word-line structures extending in a second direction and sequentially passing through the shallow trench isolation structures and the active regions;
wherein the first direction and the second direction form an acute angle.

8. The semiconductor device according to claim 7, wherein
the isolation layers are at interfaces between the shallow trench isolation structures and the active regions.

9. The semiconductor device according to claim 7, wherein
the word-line structures comprise:
first parts passing through the active regions and second parts passing between two adjacent active regions, the first parts and the second parts being alternately arranged in the extension direction of the word-line structures, the isolation layers being located between the active regions and the second parts.

* * * * *